US012795862B2

(12) United States Patent
Chen

(10) Patent No.: US 12,795,862 B2
(45) Date of Patent: Nov. 10, 2026

(54) SERVER AND ASSEMBLY METHOD THEREOF

(71) Applicant: PEGATRON CORPORATION, Taipei City (TW)

(72) Inventor: Ping-Mu Chen, Taipei City (TW)

(73) Assignee: PEGATRON CORPORATION, Taipei City (TW)

( * ) Notice: Subject to any disclaimer, the term of this patent is extended or adjusted under 35 U.S.C. 154(b) by 311 days.

(21) Appl. No.: 18/795,088

(22) Filed: Aug. 5, 2024

(65) Prior Publication Data

US 2025/0142785 A1 May 1, 2025

(30) Foreign Application Priority Data

Nov. 1, 2023 (TW) ................................ 112142077

(51) Int. Cl.
*H05K 7/20* (2006.01)
*H05K 7/14* (2006.01)

(52) U.S. Cl.
CPC ....... *H05K 7/20736* (2013.01); *H05K 7/1489* (2013.01); *H05K 7/1492* (2013.01); *H05K 7/20172* (2013.01)

(58) Field of Classification Search
CPC ............. H05K 7/20736; H05K 7/1489; H05K 7/1492; H05K 7/20172; H05K 7/1487; H05K 7/20727
USPC .......................................................... 361/695
See application file for complete search history.

(56) References Cited

U.S. PATENT DOCUMENTS

| | | | | |
|---|---|---|---|---|
| 11,096,306 B1 * | 8/2021 | Xu | G06F 1/181 |
| 2010/0033917 A1 * | 2/2010 | Du | G06F 1/181 361/679.32 |
| 2013/0028709 A1 * | 1/2013 | Chen | F04D 19/007 415/119 |
| 2022/0225543 A1 * | 7/2022 | Lo | H05K 7/20727 |

FOREIGN PATENT DOCUMENTS

| | | |
|---|---|---|
| CN | 107436662 | 12/2017 |
| CN | 215341076 | 12/2021 |
| CN | 114791757 | 7/2022 |
| TW | I482003 | 4/2015 |
| TW | I678957 | 12/2019 |

* cited by examiner

*Primary Examiner* — Jayprakash N Gandhi
*Assistant Examiner* — Kyle Oxenknecht
(74) *Attorney, Agent, or Firm* — J.C. PATENTS

(57) ABSTRACT

A server and an assembly method thereof are disclosed. The server includes a chassis base, a first fan rack, a motherboard, a second fan rack, and a fan module. The first fan rack and the motherboard are both assembled on the chassis base, and the second fan rack is disposed on a side of the motherboard relatively close to the first fan rack, in which the first fan rack and the second fan rack form a receiving space, and the fan module is placed in the receiving space.

9 Claims, 10 Drawing Sheets

SERVER AND ASSEMBLY METHOD THEREOF

CROSS-REFERENCE TO RELATED APPLICATION

This application claims the priority benefit of Taiwan application serial no. 112142077, filed on Nov. 1, 2023. The entirety of the above-mentioned patent application is hereby incorporated by reference herein and made a part of this specification.

BACKGROUND

Technical Field

The disclosure relates to a server and an assembly method thereof, and in particular to a server and an assembly method thereof utilizing internal space efficiently.

Description of Related Art

In a 1U server system, space needs to be reserved for the motherboard assembly process, and the space used for this assembly process cannot be used for other purposes after assembly, so it is easy to causes inefficiencies in space utilization.

SUMMARY

This disclosure provides a server utilizing internal space efficiently.

This disclosure provides a server assembly method utilizing internal space efficiently.

The disclosed server includes a chassis base, a first fan rack, a motherboard, a second fan rack, and a fan module. The first fan rack and motherboard are both assembled on the chassis base, and the second fan rack is disposed on a side of the motherboard relatively close to the first fan rack, in which the first fan rack and the second fan rack form a receiving space, and the fan module is placed in the receiving space.

In an embodiment, the orthographic projection range of the second fan rack on the chassis base partially overlaps with the orthographic projection range of the motherboard on the chassis base.

In an embodiment, the fan module includes a plurality of fan bodies, a plurality of first protection bases, a plurality of second protection bases, and a plurality of shock-absorbing rivets. Each fan body has a first side and a second side, in which the first side of each fan body is correspondingly disposed with a first protection base, and the second side of each fan body is correspondingly disposed with a second protection base; each fan body has a third side relatively close to the chassis base and a fourth side relatively far away from the chassis base. A part of the shock-absorbing rivets are disposed on the third side, and the remaining shock-absorbing rivets are disposed on the fourth side.

In an embodiment, the server further includes multiple first connectors and multiple second connectors, the first connector is disposed on the motherboard, and one second connector is correspondingly disposed on each first protection base so as to be plugged with the first connector in a positionwise corresponding manner.

In an embodiment, each of the first protection bases has a plurality of first rivet receiving portions, each second protection base has a plurality of second rivet receiving portions, and the first rivet receiving portion and the second rivet receiving portion are configured to receive corresponding shock-absorbing rivets.

In an embodiment, the server further includes a plurality of fastening members, in which the fastening members pass through the motherboard and are fastened into the chassis base.

An assembly method of the server disclosed in this disclosure at least includes the following. A chassis base and a first fan rack are provided, and the first fan rack is disposed on the chassis base. A motherboard and a second fan rack are provided, and the second fan rack is disposed on a side of the motherboard. The motherboard and the second fan rack are assembled on the chassis base in a direction perpendicular to the chassis base, so that the second fan rack is adjacent to the first fan rack and forms a receiving space. A fan module is assembled in the receiving space.

In an embodiment, the assembly method further includes the following. The motherboard and the second fan rack assembled in the direction perpendicular to the chassis base are slid to a positioning point on the chassis base in a direction parallel to the chassis base.

In an embodiment, the assembly method further includes the following. Multiple fastening members pass through the motherboard and are fastened into the chassis base.

In an embodiment, the assembly method further includes the following. When assembling the fan module in the receiving space, a plurality of shock-absorbing rivets disposed on each fan body of the fan module are received in a corresponding first rivet receiving portion or a second rivet receiving portion.

In an embodiment of the assembly method, the orthographic projection range of the second fan rack on the chassis base partially overlaps with the orthographic projection range of the motherboard on the chassis base.

Based on the above, in the server and the assembly method thereof according to the disclosure, the fan rack is disassembled into two independent components, and one of the fan racks is directly disposed on one side of the motherboard. Therefore, the space that needs to be reserved for the assembly process of the motherboard in the related art can be reduced, and a waste of space is prevented.

DESCRIPTION OF THE EMBODIMENTS

Figure 1:
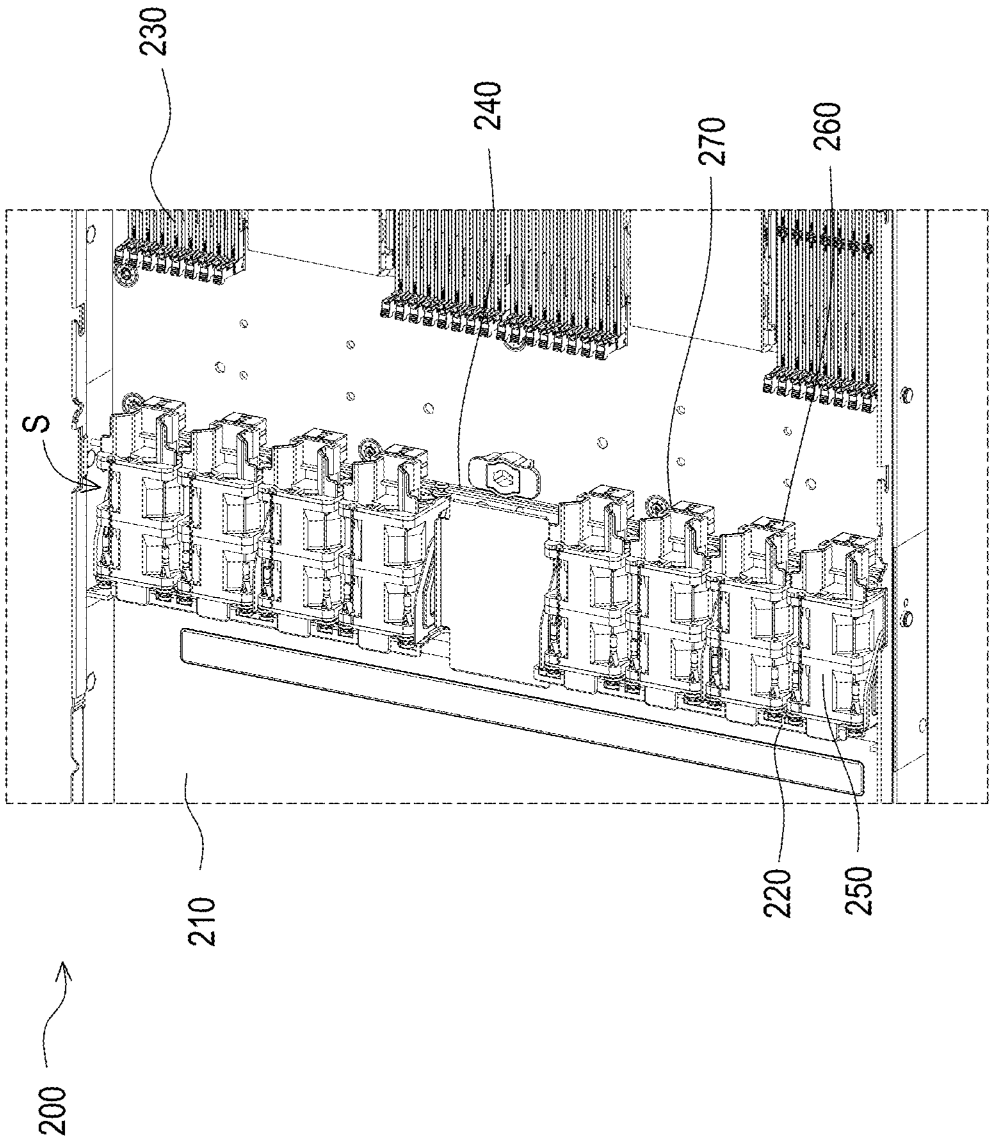
FIG. 1 is a partial schematic view of a server according to the disclosure.
Figure 2A:
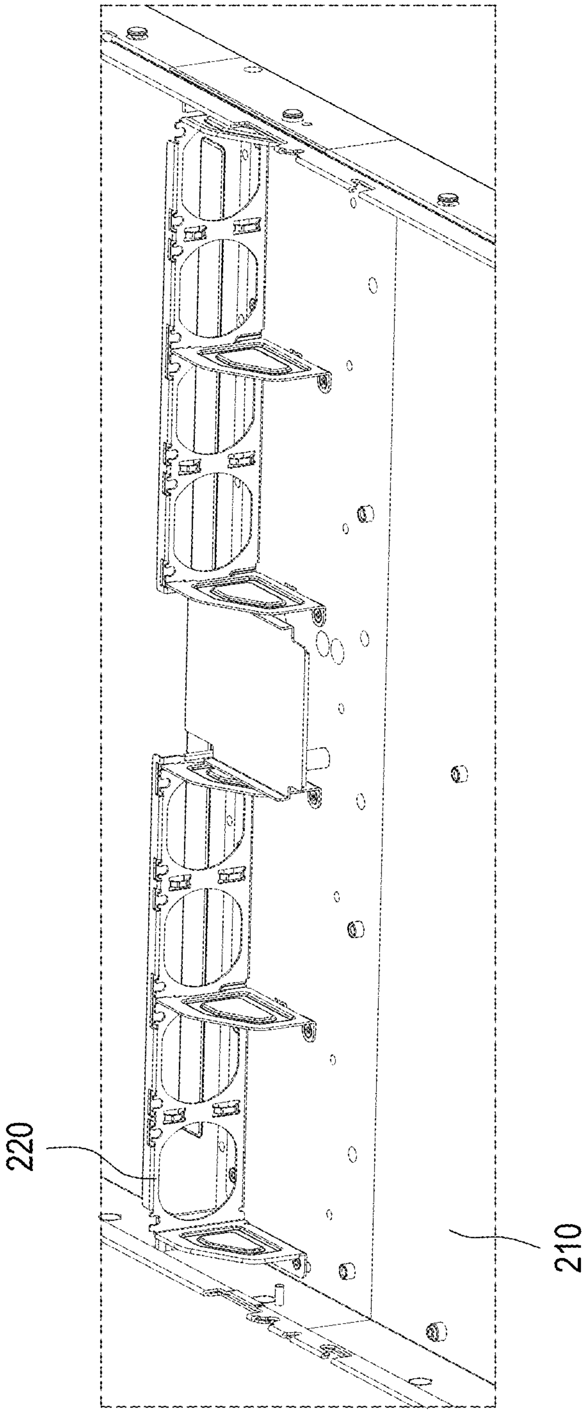
FIG. 2A is a schematic view of a chassis base and a first fan rack.
Figure 2B:
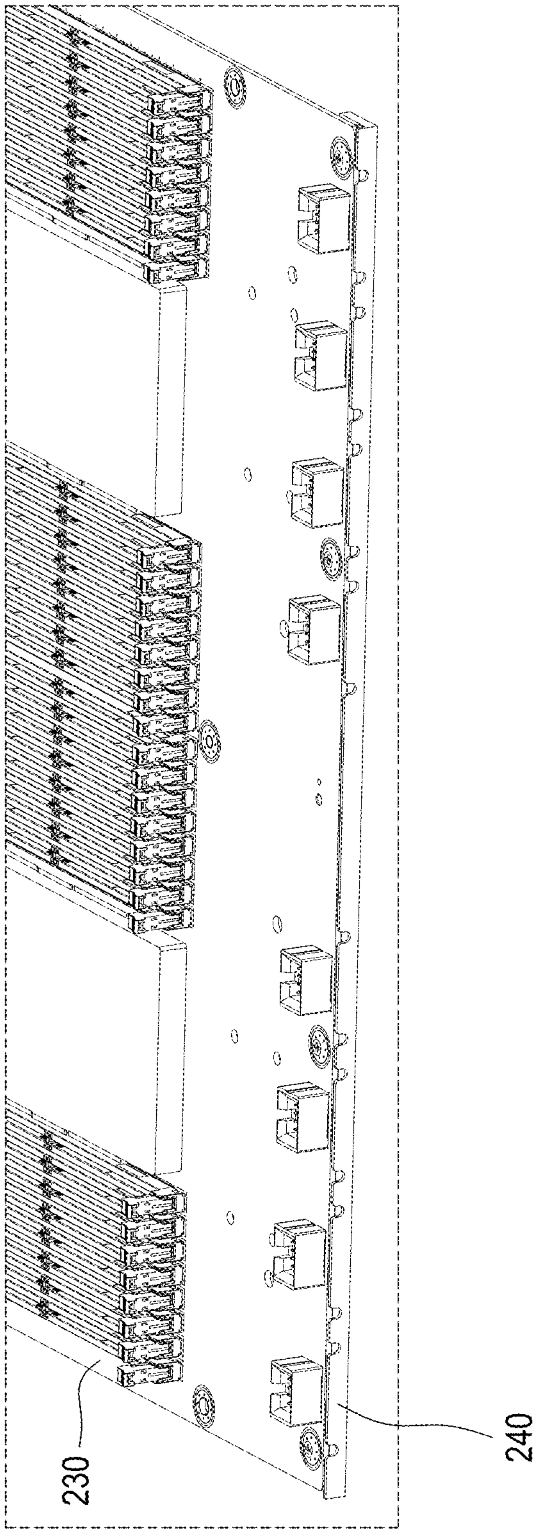
FIG. 2B is a schematic view of a motherboard and a second fan rack.

FIG. 1 is a partial schematic view of a server according to the disclosure, FIG. 2A is a schematic view of a chassis base and a first fan rack, and FIG. 2B is a schematic view of a motherboard and a second fan rack.

Please refer to FIG. 1, FIG. 2A and FIG. 2B at the same time. A server 200 in this embodiment includes a chassis base 210, a first fan rack 220, a motherboard 230, a second fan rack 240, and a fan module 250. The first fan rack 220 and the motherboard 230 are both assembled on the chassis base 210, and the second fan rack 240 is disposed on a side of the motherboard 230 relatively close to the first fan rack 220, in which the first fan rack 220 and the second fan rack 240 form a receiving space S, and the fan module 250 is placed in the receiving space S.

Based on the above, since the second fan rack 240 is disposed on the side of the motherboard 230 relatively close to the first fan rack 220, an orthographic projection range of the second fan rack 240 on the chassis base 210 partially overlaps with an orthographic projection range of the motherboard 230 on the chassis base 210.

In conventional server systems, the motherboard and the fan rack are separated by a gap, and thus the orthographic projection ranges of the motherboard and the fan rack on the chassis base do not overlap with each other. The fan module 250 in the server 200 of this embodiment is disposed closer to the motherboard 230 than conventionally, which reduces the gap between the fan module 250 and the motherboard 230, thereby the space inside the server 200 is utilized efficiently.

Figure 3A:
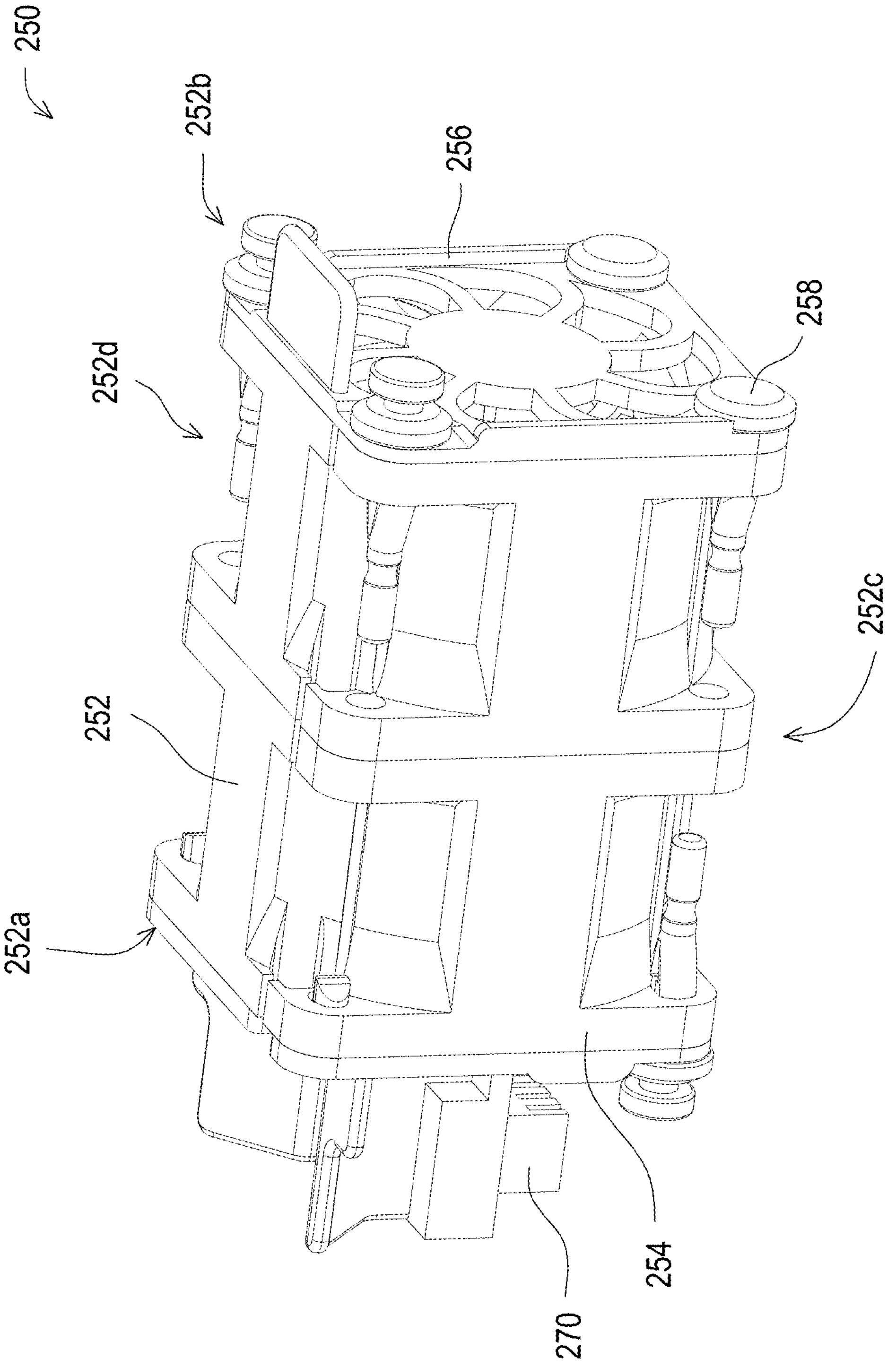
FIG. 3A and FIG. 3B are schematic views of a fan module.
Figure 3B:
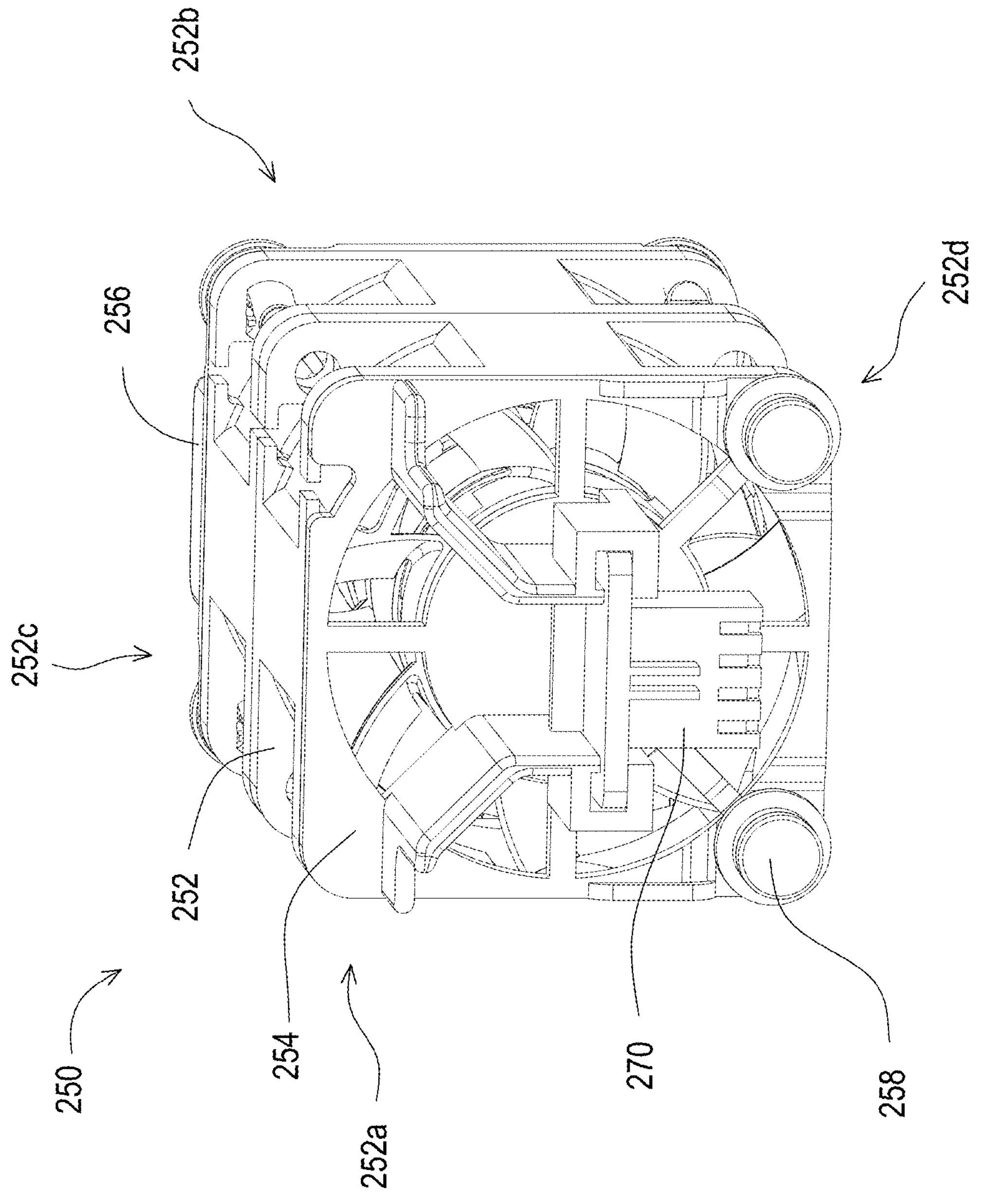

FIG. 3A and FIG. 3B are schematic views of the fan module. Please refer to FIG. 1, FIG. 3A, and FIG. 3B at the same time. The fan module 250 includes a plurality of fan bodies 252, a plurality of first protection bases 254, a plurality of second protection bases 256, and a plurality of shock-absorbing rivets 258. One single fan body 252 is assembled with one first protection base 254, one second protection base 256, and the shock-absorbing rivets 258.

Specifically, each fan body 252 has a first side 252*a* and a second side 252*b*, the first side 252*a* of each fan body 252 is correspondingly disposed with a first protection base 254, and the second side 252*b* of each fan body 252 is correspondingly disposed with a second protection base 256.

In addition, each fan body 252 has a third side 252*c* relatively close to the chassis base 210 and a fourth side 252*d* relatively far away from the chassis base 210. The third side 252*c* is disposed with four shock-absorbing rivets 258. On the third side 252*c*, two shock-absorbing rivets 258 are assembled on the first protection base 254, and two shock-absorbing rivets 258 are assembled on the second protection base 256. On the fourth side 252*d*, two shock-absorbing rivets 258 are assembled on the second protection base 256.

The server 200 further includes multiple first connectors 260 and multiple second connectors 270, in which the first connector 260 is disposed on the motherboard 230, and one second connector 270 is correspondingly disposed on each first protection base 254 so as to be plugged with the first connector 260 in a positionwise corresponding manner. Through the plugging of the first connector 260 and the second connector 270, the motherboard 230 and the fan body 252 are electrically connected, so signals transmitted from the motherboard 230 may drive the fan body 252 to operate.

Figure 4:
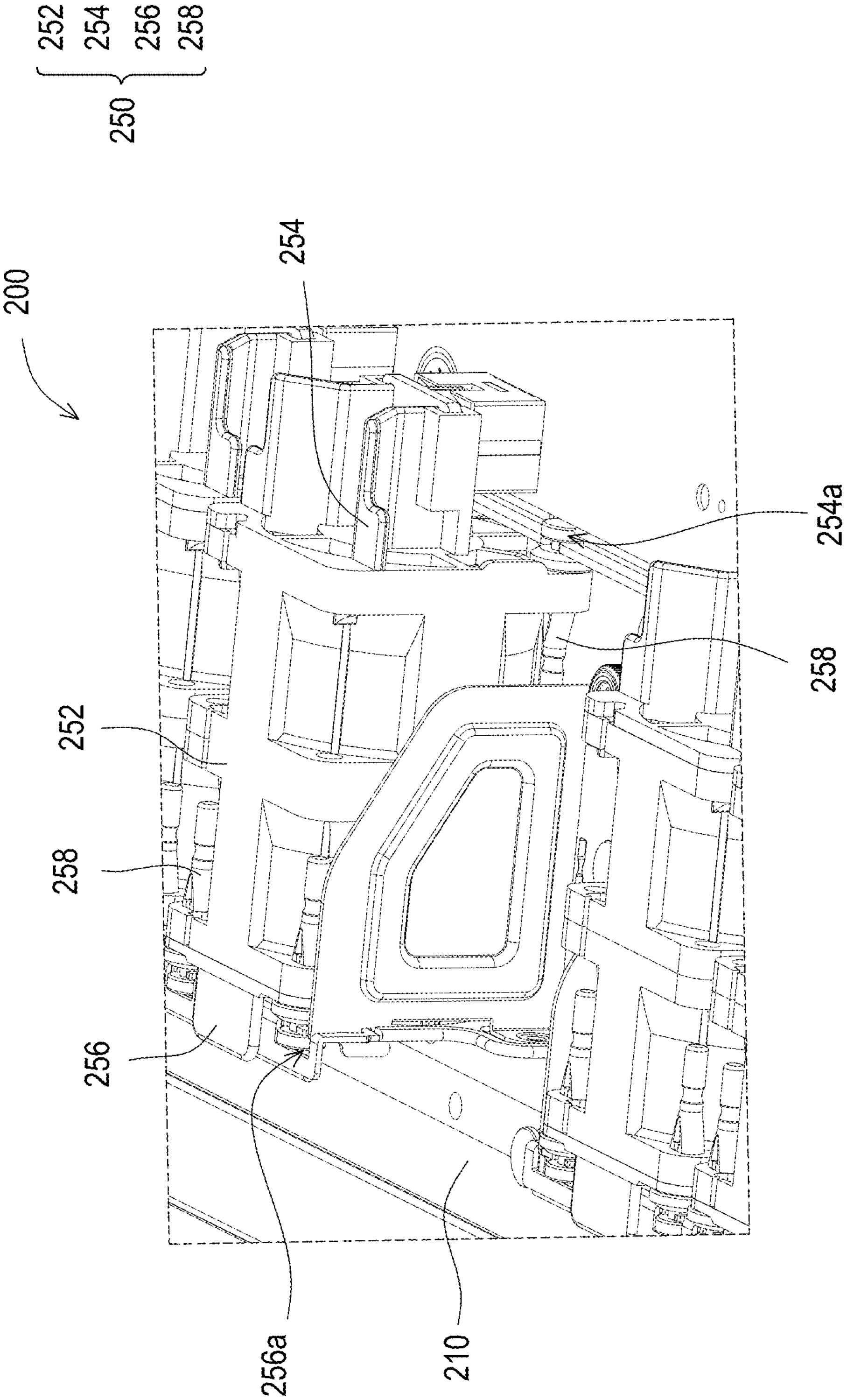
FIG. 4 is a partial enlarged schematic view of the fan module of FIG. 1 placed in a receiving space formed by the first fan rack and the second fan rack.

FIG. 4 is a partial enlarged schematic view of the fan module of FIG. 1 placed in the receiving space formed by the first fan rack and the second fan rack. Please refer to FIG. 4. Incidentally, in order to enable the fan module 250 to be placed in the receiving space S formed by the first fan rack 220 and the second fan rack 240, a first rivet receiving portion 254*a* may be disposed at the first protection base 254, and a second rivet receiving portion 256*a* may also be disposed at the second protection base 256, in which the first rivet receiving portion 254*a* and the second rivet receiving portion 256*a* are used to receive corresponding shock-absorbing rivets 258.

Figure 5A:
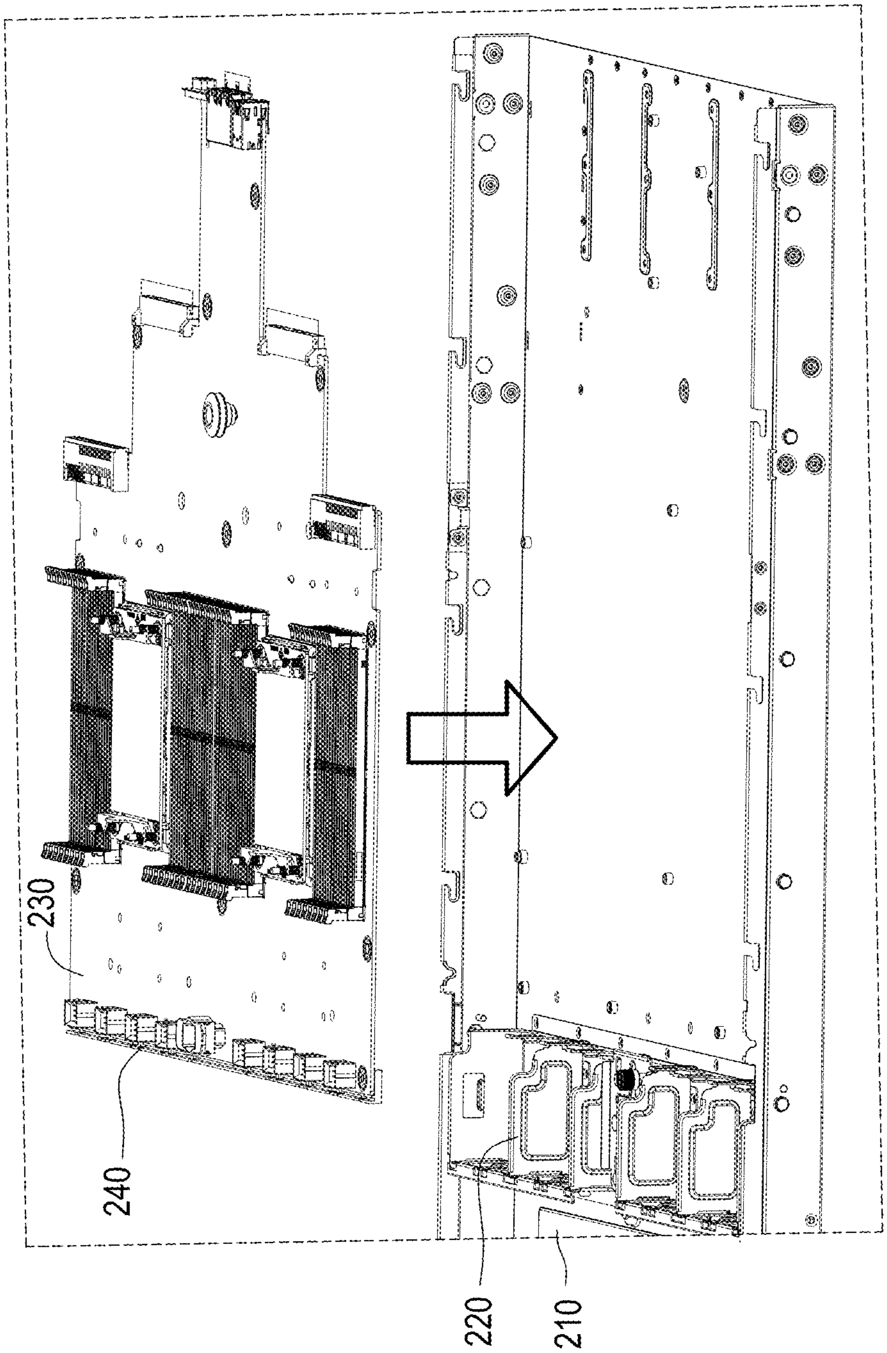
FIG. 5A and FIG. 5B are schematic views of the motherboard assembled to the chassis base.
Figure 5B:
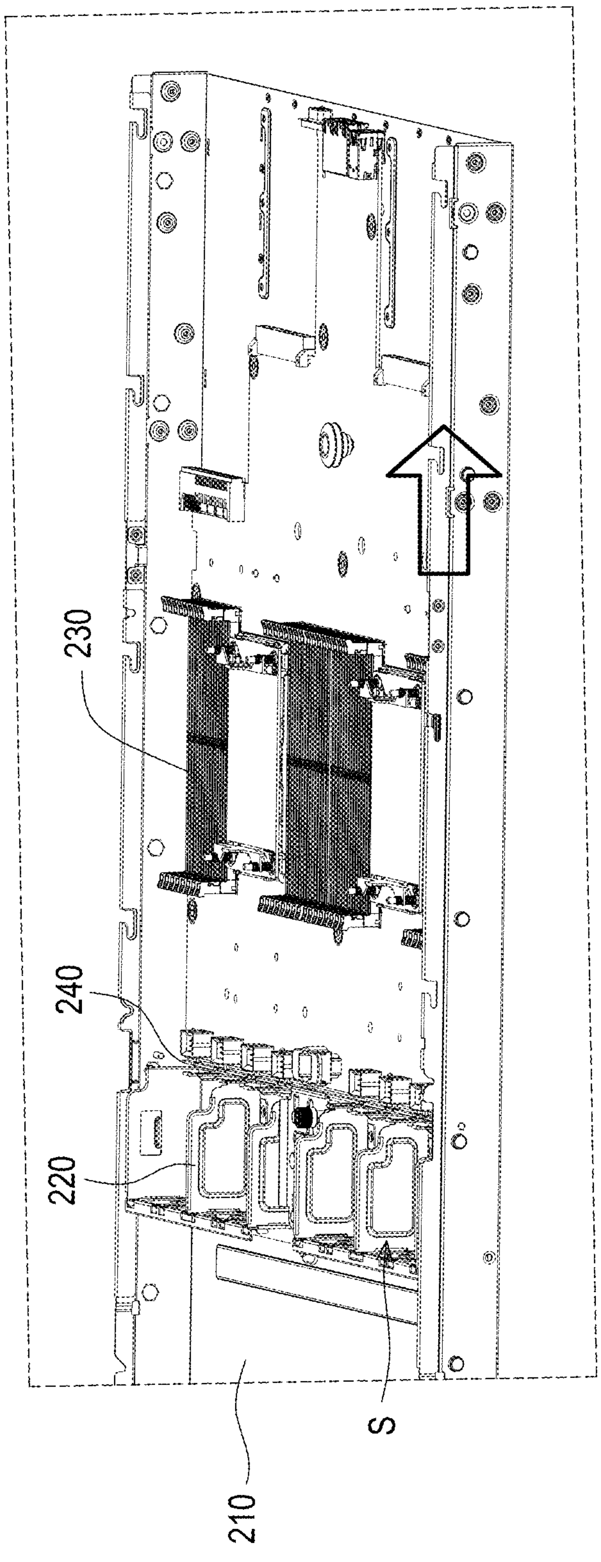

FIG. 5A and FIG. 5B are schematic views of the motherboard assembled to the chassis base. As shown in FIG. 5A, the first fan rack 220 is first assembled to the chassis base 210 so that the first fan rack 220 is fixed on the chassis base 210. Next, the motherboard 230 is placed into the interior of the chassis base 210 from above.

As shown in FIG. 5B, the motherboard 230 is slid toward a side wall of the chassis base 210 to a positioning point, in which the sliding direction of the motherboard 230 is in an opposite direction toward the first fan rack 220.

Figure 5C:
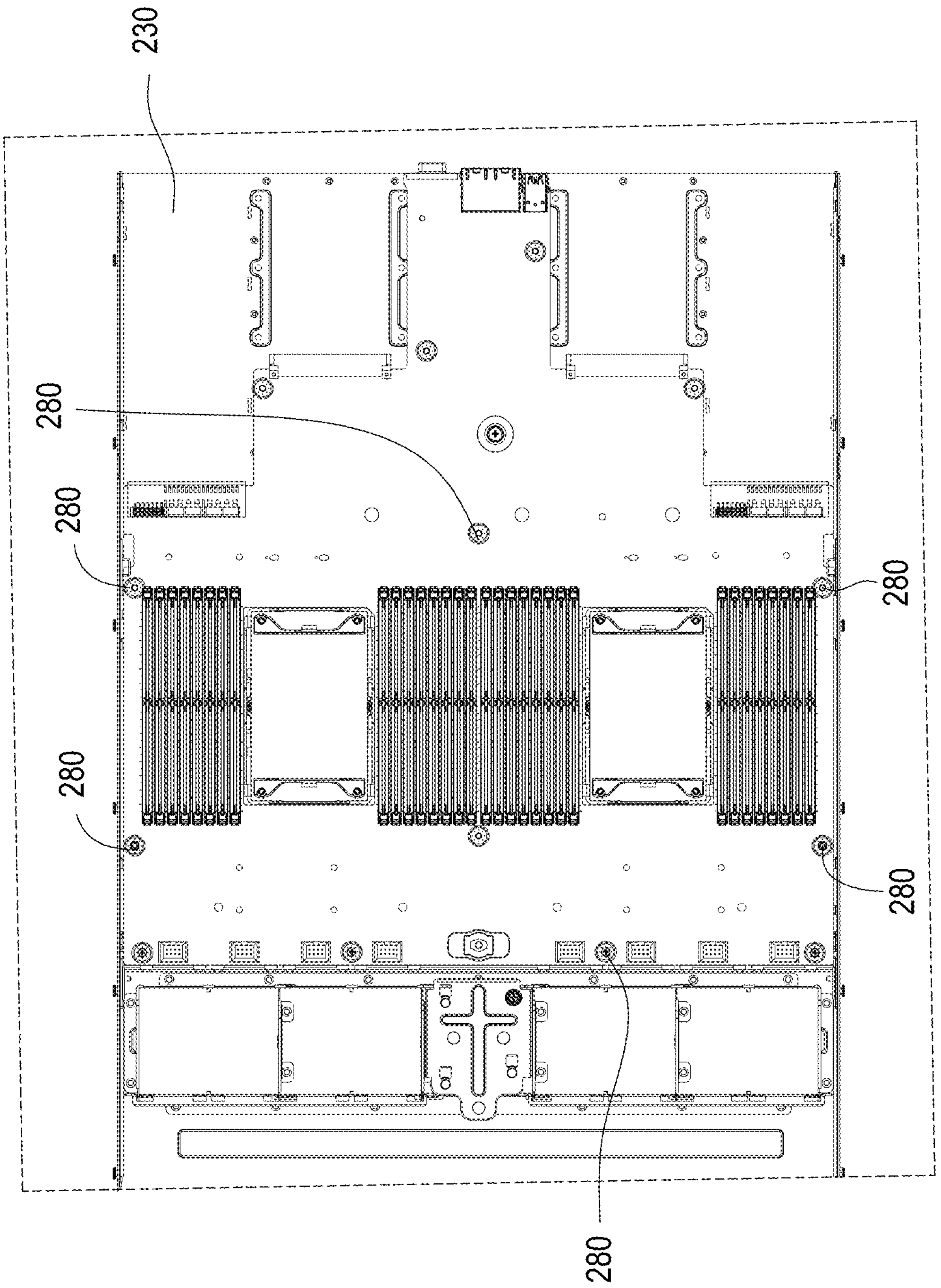
FIG. 5C is a schematic view of the motherboard fastened to the chassis base.

FIG. 5C is a schematic view of the motherboard fastened to the chassis base. Please refer to FIG. 5C. The server 200 further includes a plurality of fastening members 280, in which the fastening members 280 pass through the motherboard 230 and are fastened into the chassis base 210 to fix the motherboard 230 to the chassis base 210.

Afterward, the fan module 250 shown in FIG. 3A is placed into the receiving space S shown in FIG. 5B, in which the shock-absorbing rivets 258 (shown in FIG. 3B) are received in the corresponding first rivet receiving portion 254*a* (shown in FIG. 4) or the second rivet receiving portion 256*a* (shown in FIG. 4) according to the disposed positions thereof. Also, the first connector 260 (shown in FIG. 1) and the second connector 270 (shown in FIG. 1) are plugged with each other. Therefore, as shown in FIG. 1, the motherboard 230 and the fan body 252 are electrically connected.

Figure 6:
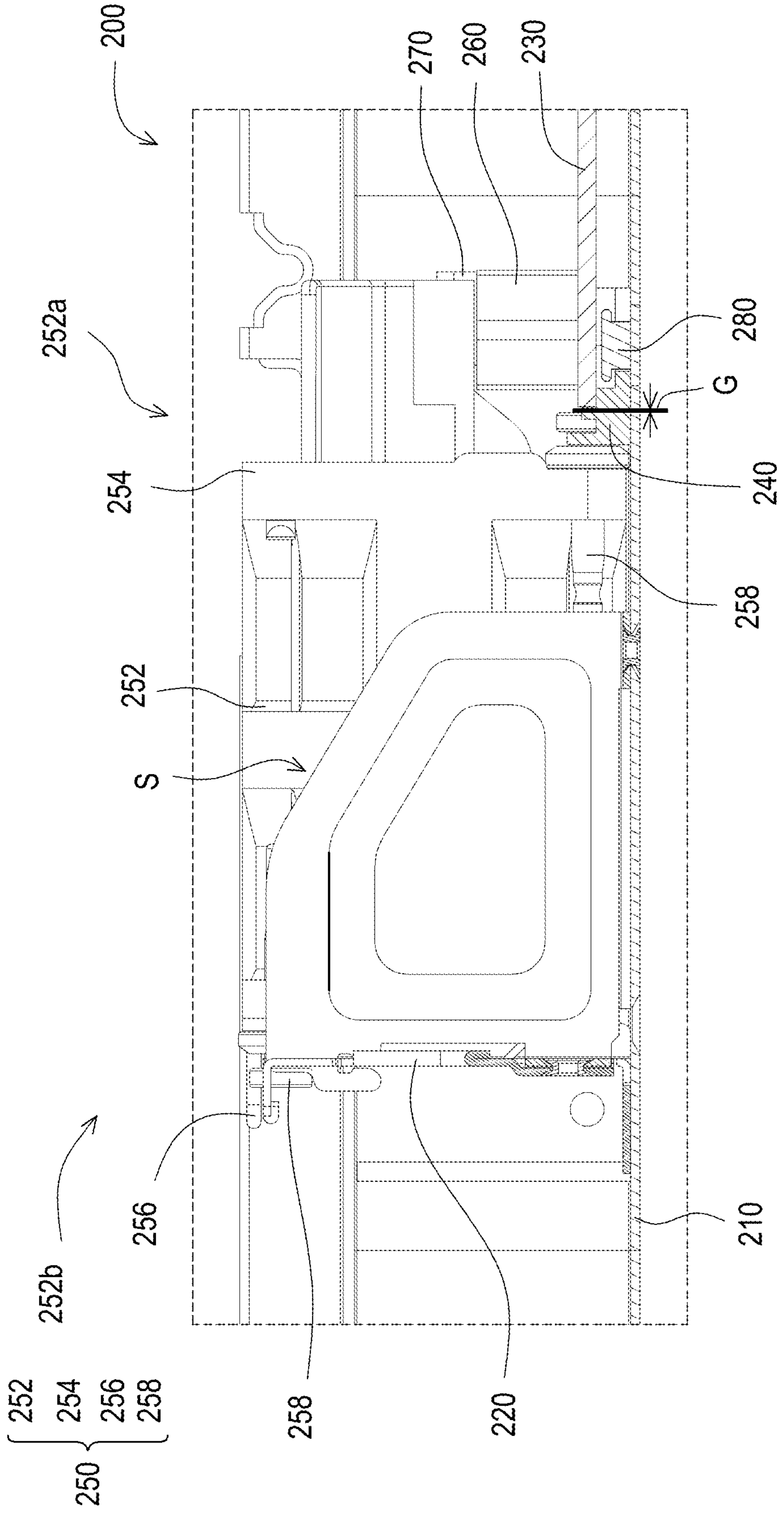
FIG. 6 is a partial side view of FIG. 1.

FIG. 6 is a partial side view of FIG. 1. Please refer to FIG. 6. It may be seen from FIG. 6 that the orthographic projection range of the second fan rack 240 on the chassis base 210 partially overlaps with the orthographic projection range of the motherboard 230 on the chassis base 210. Therefore, a distance G between the fan body 252 installed in the receiving space S formed by the first fan rack 220 and the second fan rack 240 and the motherboard 230 is shortened, and the fan body 252 is disposed very close to the motherboard 230.

In summary, in the server and the assembly method thereof in the disclosure, the fan rack is disassembled into two independent components, and the second fan rack is directly disposed on one side of the motherboard. Therefore, when assembling the motherboard to the chassis base, the side of the first fan rack close to the motherboard is open and has no parts affecting the assembly of the motherboard. Therefore, users can conveniently place the motherboard on the chassis base without interference from the first fan rack.

In addition, after the motherboard slides to the positioning point and is fixed on the chassis base, the relative positions of the first fan rack and the second fan rack are fixed, thereby the receiving space used to receive the fan module is formed, so that the fan body placed in the receiving space is disposed closer to the motherboard than the related art. In other words, the space between the motherboard and the fan rack that needs to be reserved for the assembly process of the motherboard in the related art can be efficiently reduced, thereby a waste of space is prevented.

What is claimed is:

1. A server, comprising: a chassis base; a first fan rack assembled on the chassis base; a motherboard assembled on the chassis base in a direction perpendicular to the chassis base; a second fan rack disposed on a side of the motherboard assembled on the chassis base adjacent to the first fan rack, wherein the first fan rack and the second fan rack form a receiving space; and a fan module placed in the receiving space, wherein an orthographic projection range of the second fan rack on the chassis base partially overlaps with an orthographic projection range of the motherboard on the chassis base.

2. The server as claimed in claim 1, wherein the fan module comprises:

a plurality of fan bodies, wherein each of the fan bodies has a first side and a second side;

a plurality of first protection bases, wherein each of the first sides of the fan bodies is correspondingly disposed with one of the first protection bases;

a plurality of second protection bases, wherein each of the second sides of the fan bodies is correspondingly disposed with one of the second protection bases; and a plurality of shock-absorbing rivets, wherein each of the fan bodies has a third side relatively close to the chassis base and a fourth side relatively far away from the chassis base, a part of the shock-absorbing rivets are disposed on the third side, and the remaining shock-absorbing rivets are disposed on the fourth side.

3. The server as claimed in claim 2, further comprising a plurality of first connectors and a plurality of second connectors, wherein the first connectors are disposed on the motherboard, and one of the second connectors is correspondingly disposed on each of the first protection bases so as to be plugged with the first connector in a positionwise corresponding manner.

4. The server as claimed in claim 2, wherein each of the first protection bases has a plurality of first rivet receiving portions, each of the second protection bases has a plurality of second rivet receiving portions, and the first rivet receiving portions and the second rivet receiving portions are configured to receive the corresponding shock-absorbing rivets.

5. The server as claimed in claim 1, further comprising a plurality of fastening members, wherein the fastening members pass through the motherboard and are fastened into the chassis base.

6. An assembly method of a server, comprising: providing a chassis base and a first fan rack, wherein the first fan rack is disposed on the chassis base; providing a motherboard and a second fan rack, wherein the second fan rack is disposed on a side of the motherboard; assembling the motherboard and the second fan rack on the chassis base in a direction perpendicular to the chassis base, so that the second fan rack is adjacent to the first fan rack and forms a receiving space; and assembling a fan module in the receiving space, wherein an orthographic projection range of the second fan rack on the chassis base partially overlaps with an orthographic projection range of the motherboard on the chassis base.

7. The assembly method of the server as claimed in claim 6, further comprising:

sliding the motherboard and the second fan rack assembled in the direction perpendicular to the chassis base to a positioning point on the chassis base in a direction parallel to the chassis base.

8. The assembly method of the server as claimed in claim 6, further comprising:

passing a plurality of fastening members through the motherboard and fastening into the chassis base.

9. The assembly method of the server as claimed in claim 6, further comprising:

in response to assembling the fan module in the receiving space, receiving a plurality of shock-absorbing rivets disposed on each fan body of the fan module in a corresponding first rivet receiving portion or a second rivet receiving portion.

* * * * *